United States Patent [19]
Reeds

[11] Patent Number: 4,535,249
[45] Date of Patent: Aug. 13, 1985

[54] BENCHMARK DETECTOR

[75] Inventor: John W. Reeds, Thousand Oaks, Calif.

[73] Assignee: Hughes Aircraft Company, El Segundo, Calif.

[21] Appl. No.: 505,564

[22] Filed: Jun. 17, 1983

[51] Int. Cl.³ .................... G01N 23/00; H01L 21/30
[52] U.S. Cl. .................................. 250/491.1; 250/397
[58] Field of Search ............... 250/491.1, 492.1, 492.2, 250/397, 398, 399, 310; 219/121 EB, 121 E

[56] References Cited

U.S. PATENT DOCUMENTS

| | | | |
|---|---|---|---|
| 3,875,415 | 4/1975 | Woodard | 250/492 |
| 4,177,379 | 12/1979 | Furukawa et al. | 250/306 |
| 4,310,743 | 1/1982 | Seliger | 219/121 EB |

FOREIGN PATENT DOCUMENTS

| | | | |
|---|---|---|---|
| 56-93919 | 12/1982 | Japan | 250/492.2 |
| 56-167551 | 4/1983 | Japan | 250/492.2 |

Primary Examiner—Bruce C. Anderson
Assistant Examiner—Paul A. Guss
Attorney, Agent, or Firm—A. W. Karambelas

[57] ABSTRACT

Benchmark detector (46) has two light pipe fingers (48, 50) which lie adjacent to each other at an acute angle to the orthogonal axes of movement of the stage on which the benchmark is positioned. The light pipe fingers have notches which define a rectangular opening therebetween through which a benchmark (52) can be excited to produce secondary electrons. Scintillator material adjacent the notches produces photons in the light pipes so that the position of the benchmark with respect to the detector can be established.

14 Claims, 7 Drawing Figures

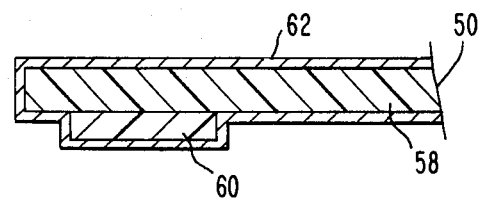
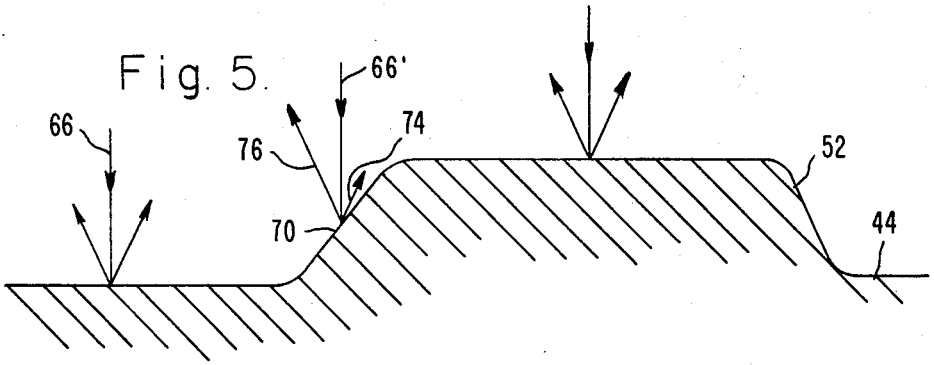
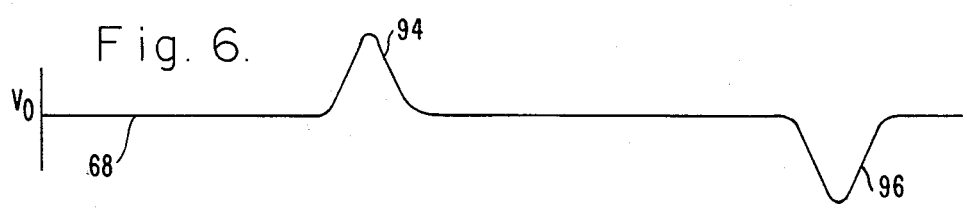
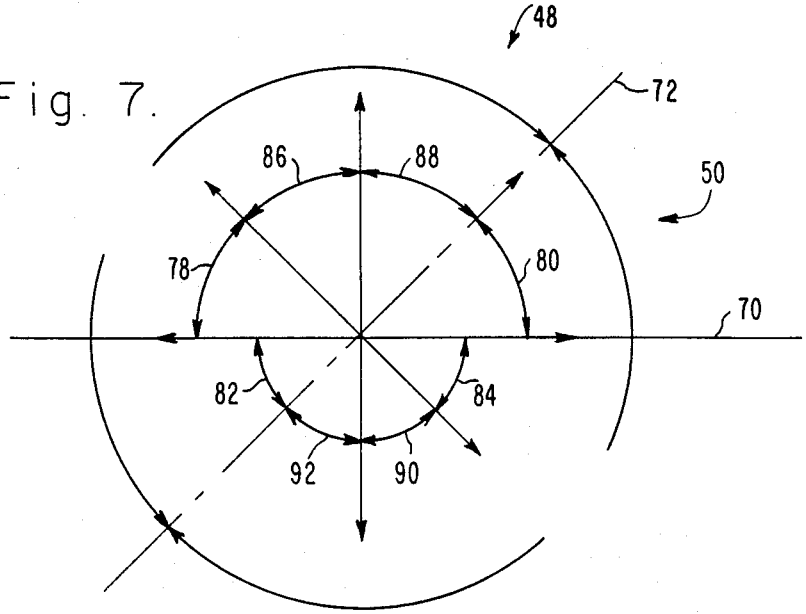

BENCHMARK DETECTOR

TECHNICAL FIELD

This invention is directed to a benchmark detector for detecting a topographical benchmark on a semiconductor chip. The benchmark detector is suitable for detecting edges of benchmarks which are in specified orthogonal positions.

BACKGROUND OF THE INVENTION

In writing on a semiconductor wafer with an electron beam or ion beam for microfabrication or resist exposure, the scanning range of the beam is quite often insufficient to scan over the entire desired area of the wafer. Also, multiple exposure levels on the same wafer must be accurately overlaid with each other. As a consequence of this, the wafer is mounted upon a positionable stage movable on two orthogonal axes. After one scan pattern is completed, the stage moves the wafer on one or both axes to a new position for writing of another scan pattern. This second scan pattern must be related in position to the first one. To achieve the coordination, topographic benchmarks are positioned with respect to the first scan pattern. Thereupon the stage moves the wafer so that it can be written with the second scan pattern. The position of the benchmark is detected and controls the stage for proper positioning of the wafer on the stage for writing the second scan pattern. For multiple level exposures, the same benchmarks are used to position the wafer for each exposure level. The benchmarks may be placed on the wafer initially in a separate operation (either optically or with an electron or ion beam), or they may be incorporated in the first pattern layer to be exposed on the wafer.

U.S. Pat. Nos. 3,849,659, 4,056,730 and 4,145,597 use four detectors for finding the orthogonal position of a benchmark. U.S. Pat. Nos. 4,119,854, 4,123,661 and 4,199,688 use single benchmark detectors. In addition, Donald E. Davis in two articles in the IBM Journal of Research and Development, one in November 1977, page 498–505 and the other at Vol. 24, No. 5, September 1980, pages 545–553 teaches the use of four orthogonally positioned detectors for determining benchmark position. The signals from four detectors are necessarily complex to determine the benchmark location, and the use of a single detector provides inadequate resolution.

SUMMARY OF THE INVENTION

In order to aid in the understanding of this invention it can be stated in essentially summary form that it is directed to a benchmark detector consisting of first and second light pipes lying adjacent each other, said light pipes each having a notch therein so that said notches face each other and define two corners of a substantially rectangular opening between said light pipes, a scintillator material on each of said light pipes adjacent said notches so that electrons striking the scintillator material cause photons in the associated light pipes, said light pipe fingers lying in a plane substantially parallel to the target surface and a line between the light pipe fingers lying at an acute angle with respect to the orthogonally positioned movement axes of the benchmark so that comparative sensing of photons in said first and second light pipes indicates the position of a benchmark.

It is thus a purpose and advantage of this invention to provide a benchmark detector for detecting the position of a benchmark on a semiconductor wafer so that the wafer may be properly positioned with respect to the electron or ion beam. It is a further purpose and advantage of this invention to provide a benchmark detector wherein two detector elements are arranged so that their subtractive signal indicates the relevant position of the benchmark, so that the position of the benchmark can be reliably determined. Other purposes and advantages of the invention will become apparent from a study of the following portion of this specification, the claims and the attached drawings.

BRIEF DESCRIPTION OF THE DRAWINGS

FIG. 4 is an enlarged section taken generally along the line 4—4 of FIG. 3, showing the end of the benchmark detector.

FIG. 5 is a schematic diagram showing the impingment of a primary electron beam and the back-scattered electrons.

FIG. 6 is a potential diagram showing the net potential output of the two detectors for different positions of the beam across the benchmark and adjacent wafer.

FIG. 7 is a plan view showing the relative backscatter intensities from the edge of a benchmark mesa.

DETAILED DESCRIPTION OF THE INVENTION

Figure 1:
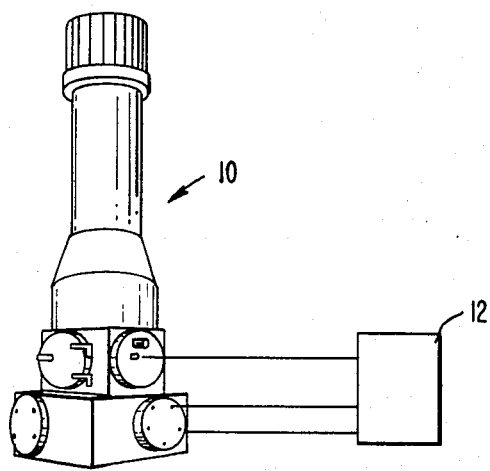
FIG. 1 is a perspective view of a charged particle beam column with its target chamber, and including the benchmark detector of this invention.

FIG. 1 illustrates a focused beam column 10 which has control unit 12 connected thereto. Focused beam column may be an electron beam column or an ion beam column for exposure of resist or for direct implantation. Control unit 12 is preferably a computer which controls the energy of the focused beam, beam steering as to position and lateral positioning of the target.

Figure 2:
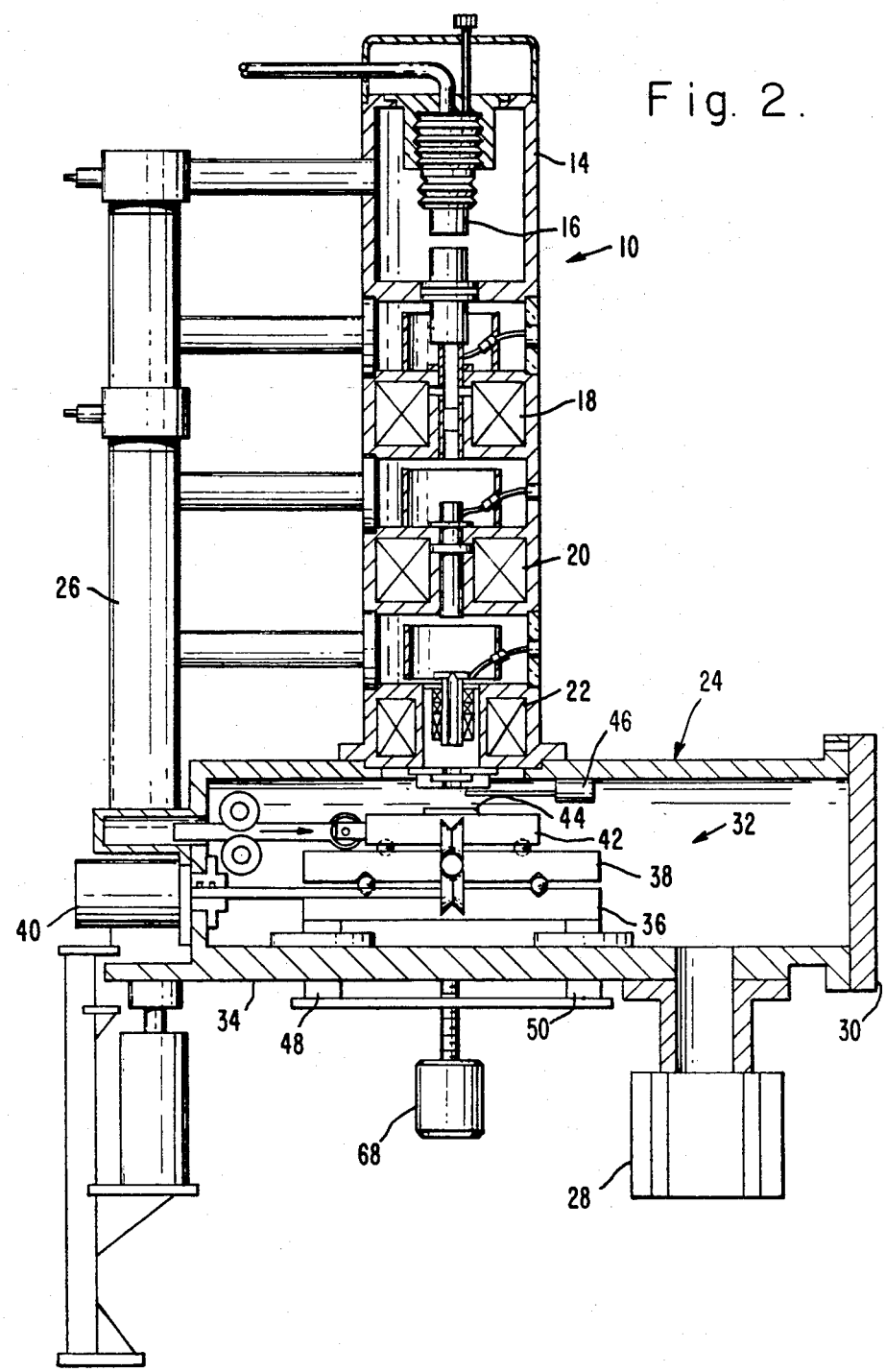
FIG. 2 is a longitudinal section through the column of FIG. 1 and the target chamber at its base.

FIG. 2 shows the column in more detail, with vacuum housing 14 enclosing the operative parts of the column including source 16 and lenses 18, 20 and 22. If the beam is an ion beam, an ion analyzer would be appropriate. Furthermore, beam steering is appropriate so that the beam is driven by the computer in a pattern over the target, in accordance with the desired pattern exposure.

Target chamber 24 is attached to the lower end of vacuum housing 14. Vacuum connections 26 draw the vacuum on housing 14 while vacuum pump 28 draws the vacuum on the target chamber. Flange 30 permits access to the target chamber for changing of wafers. Instead of the flange 30, a valve with an air lock chamber may be installed.

It is contemplated that in the present focused beam system the scanning pattern of the beam as driven by its computer driver and control unit 12 is not sufficient to cover an adequate area on the wafer. For this reason a two-axis positionable stage 32 is mounted on the floor 34 of target chamber 24. The two axis stage has a base plate 36 mounted with respect to floor 34. Intermediate plate 38 is mounted to move toward and away from the viewer in FIG. 2 on the top of base plate 36 and is driven by intermediate plate motor 40. The top plate is wafer support plate 42 which is movable in the left to right direction in FIG. 2. Wafer 44, mounted on wafer support plate 42, thus has movement in the X and Y coordinates, which are in the plane of the wafer 44.

Figure 3:
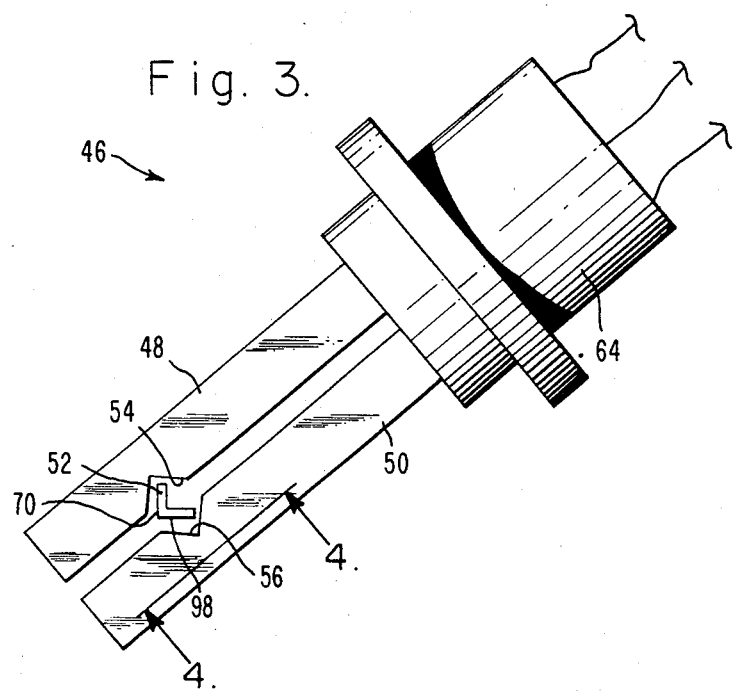
FIG. 3 is a plan view of the detector portion of the benchmark detector of this invention.

Benchmark detector 46 is generally indicated in FIGS. 2 and 3. Benchmark detector 46 comprises a pair of fingers 48 and 50 positioned so that a line running parallel to and between the light pipe fingers lies substantially parallel to the target surface. That line also lies at a 45° (acute) angle with respect to the orthogonally positioned movement axes of the chevron benchmark 52. For the purpose of this discussion, the benchmark 52 is a topographical benchmark in the form of a mesa on the top of the wafer as indicated in FIG. 5. A topographical benchmark in the form of a groove will act in the same way. It is with respect to these topographical benchmarks that the benchmark detector of this invention is described. However, it is equally useful in detecting the position of a benchmark made of a different material, such as a heavy metal which has a different electron backscatter coefficient than the base material.

Fingers 48 and 50 have notches 54 and 56, respectively, therein which are 45° notches within the finger so that they define a substantially square opening through which the benchmark 52 is seen. The opening may also be of other shape (i.e., rectangular or circular) and the detector will operate in identical manner. The rectangular opening gives the most sensitivity when used in a system where the beam is deflected over a rectangular area and the deflected beam must clear the opening in the detector. FIG. 4 shows a section through a portion of the finger 50, and is representative of the finger 48. Finger 50 has a lightpipe body 58 of optically conductive polymer composition material such as polymethylmethacrylate. Scintillator 60 is positioned on the underside of the body adjacent the two walls of notch 56. The finger is then covered all over by an opaque layer as by aluminum layer 62. This aluminum layer is thin enough, typically 1000 angstroms, so that high energy backscattered electrons may penetrate through it and strike the scintillator. When an electron strikes the scintillator, photons are produced and these are conducted back in the light pipe body 58 to a photodetector in boss 64 on which the light pipe fingers are mounted. There is a photodetector for each of the two light pipe fingers.

As seen in FIG. 5, when the electron beam 66 scans the flat surface, the returning back scatter electrons are radiated symmetrically in all backscattered directions. When the photodetector outputs from the two fingers are subtracted, then the net output is zero as shown in point 68 in FIG. 6. The lateral position of the net voltage indicated in FIG. 6 corresponds to the lateral position of the impingement of the electron beam on the target in FIG. 5.

In FIG. 7, the line 70 represents the edge of mesa and the line 72 represents the center dividing line between the two light pipe fingers 48 and 50. While there are only two outputs from the benchmark detector of this invention, the amplitude of the backscattered electrons at the edge of the mesa is divided into eight 45° arcuate segments for the purpose of analysis. When the electron beam 66' strikes the line 70 at the edge of the benchmark mesa, the back-scattered electrons exhibit a strong directional effect. This is because when an electron beam scans across the edge of a topographical feature such as the benchmark mesa 52, the backscattered electrons directed into the mesa are partially absorbed to thus reduce the backscatter intensity as compared to those electrons scattered away from the mesa. In FIG. 5 when the electron beam 66' strikes at the line 70 which represents the edge of the mesa, the backscatter intensity represented by vector 74 is less than the backscatter intensity away from the mesa represented by vector 76. With the backscatter vector intensities divided into eight segments as shown in FIG. 7, it is clear that the sector 78 is equal in intensity to the sector 80 on the other light pipe finger. Similarly, sectors 82 and 84 are equal. Thus, when the outputs of the two photodetectors are subtracted, these sectors are eliminated. However, the sectors 86 and 88 represent higher backscatter intensities than the opposite sectors 90 and 92. It is seen from FIG. 7 that the sectors 80, 84, 90 and 92 are on the light pipe finger 50 and the sectors 82, 78, 86 and 88 are on the light pipe finger 48. Thus, when the signals from the photodector associated with light pipe 50 is subtracted from the signal of the photodetector associated with light pipe 48, the result is a positive signal 94 indicated in FIG. 6.

When the electron beam reaches the other edge of the mesa, the negative signal 96 is produced. It is seen that since the division between the two light pipes is 45° with respect to the orthogonally arranged benchmarks, the same considerations apply when the edge of the benchmark is at right angles to the benchmark edge 70, for example the benchmark edge 98 seen in FIG. 3. In this way, benchmarks positioned with respect to the orthogonal directions of stage movement are detected without the requirement for switching of the detector segments. The benchmark is on target wafer 44 and the target wafer is mounted on the positioning stage 32. The benchmark detector is connected through control unit 12 to drive the positioning stage on the orthogonal positioning axes until the benchmark is in a predetermined position with respect to the benchmark detector. For detection of heavy metal benchmarks, the signals from the light pipe fingers are added together instead of taking their difference.

This invention has been described in its presently contemplated best mode and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A benchmark detector consisting of only first and second light pipes lying adjacent each other, said light pipes each having a notch therein so that said notches face each other and define two corners of an opening between said light pipes, a scintillator material on each of said light pipes adjacent said notches so that electrons striking the scintillator material generate photons in the associated light pipes, said detector being for positioning substantially parallel to the surface of the target carrying a benchmark and with a line between the light pipes lying at an acute angle with respect to the axes of movement of the target carrying the benchmark so that comparative sensing of photons in said first and second light pipes indicates the position of the benchmark.

2. The benchmark detector of claim 1 wherein a photodetector is associated with each of said light pipes so that each of said photodetectors produces a signal related to the photons in the corresponding light pipe.

3. The benchmark detector of claim 1 wherein said benchmark detector is positioned within a charged particle beam device, having a beam axis so that said benchmark detector can detect the position of a target with respect to the beam axis for positioning the target at a selected position with respect to the beam axis.

4. The benchmark detector of claim 3 wherein the target is mounted on a stage so that said benchmark detector can command the stage to move the benchmark into a preselected position with respect to said benchmark detector.

5. The benchmark detector of claim 3 wherein said charged particle beam machine is an electron beam machine.

6. The benchmark detector of claim 3 wherein said charged particle beam machine is an ion beam machine.

7. A benchmark detector comprising:
first and second light pipe fingers facing each other and lying adjacent each other so that the separate light pipes of said separate first and second light pipe fingers are not optically joined, there being only two said light pipe fingers;
walls in both said first and second fingers defining facing notches in said first and second fingers so that said notches define a square opening with the division between said light pipe fingers extending at an acute angle through said rectangular opening, scintillator material on each of said first and second light pipes adjacent said notches so that electrons impinging said scintillator material generate photons in said first and second light pipes as a function of the number of impinging electrons so that when a benchmark is positioned adjacent said opening, and when a charged particle beam impinges on the benchmark and secondary electrons are backscattered onto the scintillator material, the relative photon intensity in said first and second light pipe fingers is related to the positioning of the benchmark with respect to said notches so that the relative position of the benchmark with respect to said notches is determined on two orthogonal axes lying at an acute angle with respect to the division between said light pipes.

8. The benchmark detector of claim 7 wherein the benchmark is on a target and said target is positioned on a positioning stage, and said benchmark detector is connected to drive said positioning stage so that said benchmark is in a predetermined position with respect to said benchmark detector.

9. A benchmark detector for detecting the position of a benchmark on a target surface where the target is mounted on a stage adjustable on two substantially orthogonal positioning axes, said benchmark detector consisting of only first and second light pipes lying adjacent each other, said light pipes each having a notch therein so that said notches face each other and define an opening through which a benchmark on the target surface can be seen, the line between said light pipes at said opening lying substantially parallel to the surface of the target and lying at an acute angle with respect to the orthogonal movement axes of the targets, a scintillator material on each of said light pipes adjacent said notches so that electrons striking the scintillator material generate photons in the associated light pipe so that comparative sensing of photons in said first and second light pipes indicates the position of the benchmark on both orthogonal axes.

10. The benchmark detector of claim 9 wherein a photodetector is associated with each of said light pipes so that each of said photodetectors produces a signal related to the photons in the corresponding light pipe.

11. The benchmark detector of claim 9 wherein said benchmark detector is positioned within a charged particle beam device, having a beam axis so that said benchmark detector can detect the position of a target with respect to the beam axis for positioning the target at a selected position with respect to the beam axis.

12. The benchmark detector of claim 11 wherein the target is mounted on a stage so that said benchmark detector can command the stage to move the benchmark into a preselected position with respect to said benchmark detector.

13. The benchmark detector of claim 11 wherein said charged particle beam machine is an electron beam machine.

14. The benchmark detector of claim 11 wherein said charged particle beam machine is an ion beam machine.

* * * * *